(12) United States Patent
Parizi et al.

(10) Patent No.: US 6,501,030 B1
(45) Date of Patent: Dec. 31, 2002

(54) GROUNDING PLUG FOR PRINTED CIRCUIT BOARD

(75) Inventors: Bobby Parizi, San Jose, CA (US); Nguyen Tu Nguyen, San Jose, CA (US); Saeed Seyedarab, Los Altos Hills, CA (US); Toan Nguyen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/427,294

(22) Filed: Oct. 26, 1999

(51) Int. Cl.[7] .............. H05K 1/00; H05K 9/00; H05K 5/02
(52) U.S. Cl. .......... 174/250; 174/40 CC; 174/51; 361/808
(58) Field of Search .......... 174/138 E, 138 G, 174/40 CC, 356 C, 35 R, 250, 51; 361/808, 809

(56) References Cited

U.S. PATENT DOCUMENTS

| | | | | |
|---|---|---|---|---|
| 3,154,281 A | * | 10/1964 | Frank | |
| 3,213,500 A | * | 10/1965 | Thompson | |
| 5,825,633 A | * | 10/1998 | Bujalski et al. | |
| 5,917,709 A | * | 6/1999 | Johnson et al. | |
| 6,140,591 A | * | 10/2000 | Osborne et al. | |
| 6,259,032 B1 | * | 7/2001 | Fernandez | |
| 6,308,394 B1 | * | 10/2001 | Boe | |
| 6,333,855 B2 | * | 12/2001 | Drabaonnaud et al. | |
| 6,347,042 B1 | * | 2/2002 | White | |
| 6,424,538 B1 | * | 7/2002 | Paquin | |

OTHER PUBLICATIONS

Self–Clinching Standoffs, Above Board Electronics, printed from website www.aboveboardelectronics.com on Jan. 14, 2002.

* cited by examiner

Primary Examiner—Kamand Cuneo
(74) Attorney, Agent, or Firm—Beyer, Weaver & Thomas, LLP; Jeffrey K. Weaver, Esq.

(57) ABSTRACT

A grounding plug structure configured for push-type snap lock fastening in circuit board screw holes is provided with a resilient deformable conductive member. When a circuit board with one or more such plug structures fastened thereto is mounted with respect to a tray or chassis, the conductive portion of the plug structure is deformed against a surface of the tray, forming an effective conductive pathway, e.g., for grounding, between the tray and the circuit board. In this way, grounding pathways can be established while eliminating the need for at least some screw mounting and/or standoff structures.

12 Claims, 6 Drawing Sheets

GROUNDING PLUG FOR PRINTED CIRCUIT BOARD

FIELD OF THE INVENTION

The present invention relates to the grounding of printed circuit boards and in particular to a readily-installable plug for grounding a printed circuit board to a chassis or similar structure.

BACKGROUND OF THE INVENTION

Printed circuit boards (PCB) which are installed in a chassis, cabinet, rack or the like, often are advantageously grounded to (all or part of) a metallic or conductive structure, typically a sheet metal tray or plate which forms all or part of a chassis, cabinet or the like. In many devices, a conductive ground path from the PCB to the tray is by way of a screw coupling, often engaging a tray standoff structure, with such screw coupling typically forming part or all of the mechanical support for the PCB. While such screw coupling can be effective for both grounding purposes and mechanical support purposes, the cost of providing multiple screws, standoffs and the like can be undesirably high. Accordingly, it would be useful to provide an apparatus, system and method for establishing desired grounding paths which can reduce or avoid at least some of the costs associated with previous approaches.

In addition to the material costs associated with screw-mounting, the time or effort needed for installing screws both in initial fabrication or assembly of an electronic device, and in any later repairs, upgrades and the like, can be undesirably high. Accordingly, it would be useful to provide apparatus, systems and methods which can achieve desired grounding paths relatively rapidly (compared with, e.g., screw mounting). Previous screw-mounting approaches for establishing ground paths are at least partially affected by PCB layouts, e.g., in the location of the screw holes, ground traces or printed wires and the like. Because of the expense involved in redesigning, recertifying, and/or testing of new or modified circuit board configurations, it would be useful to provide improved grounding path apparatus, systems and methods which can be implemented in a fashion compatible with existing circuit boards or other components, e.g., without requiring redesign or modification of existing circuit boards.

SUMMARY OF THE INVENTION

According to one aspect, the present invention utilizes a structure which provides a body portion configured to engage existing screw holes, preferably in a simple push-installation fashion, and which provides support for a conductive structure capable of creating an effective ground path from a circuit board to a tray or similar structure. In one aspect, the conductive structure is configured to be resiliently urged or deformed against (in contact with) the tray, e.g., to provide a system establishing a reliable and effective grounding path.

In one aspect, a grounding plug structure configured for push-type snap lock fastening in circuit board screw holes is provided with a resilient deformable conductive member. When a circuit board with one or more such plug structures fastened thereto is mounted with respect to a tray or chassis, the conductive portion of the plug structure is deformed against a surface of the tray, forming an effective conductive pathway, e.g. for grounding, between the tray and the circuit board. In this way, grounding pathways can be established while eliminating the need for at least some screw mounting and/or standoff structures.

DETAILED DESCRIPTION OF THE PREFERRED EMBODIMENT

Figure 1:
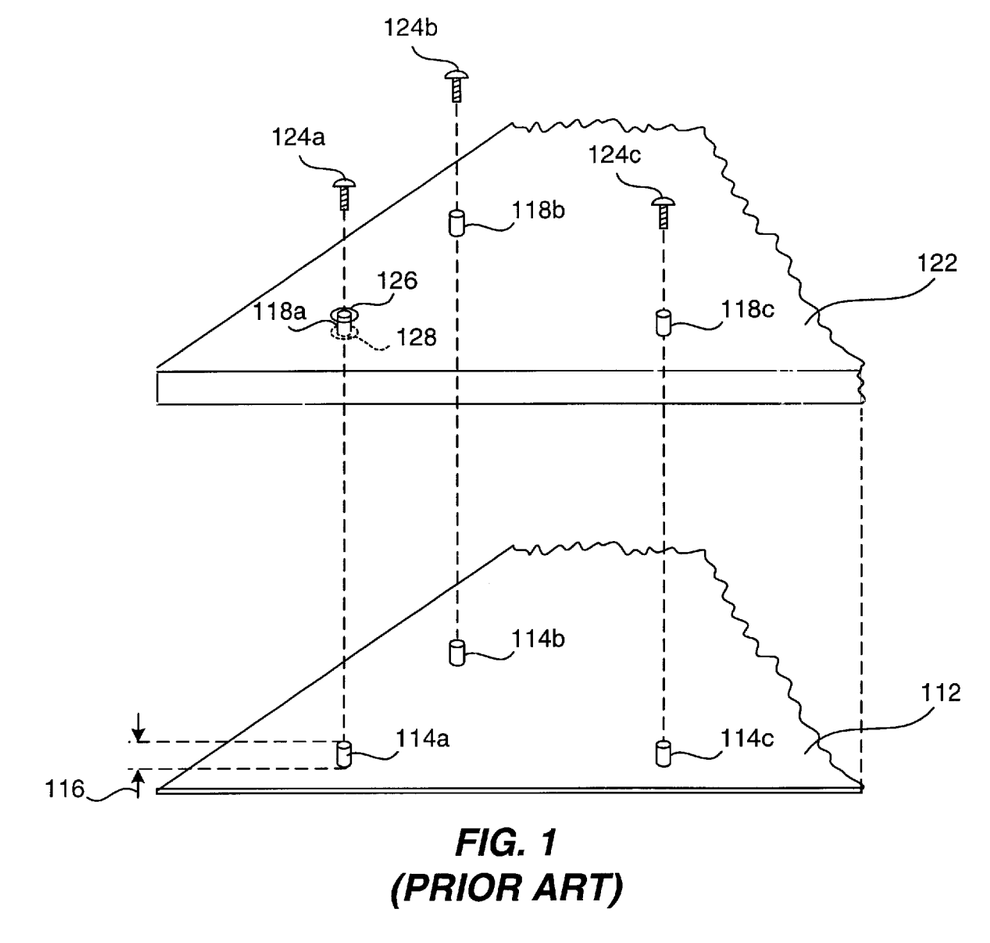
FIG. 1 is a partial, exploded, perspective view of screw mounting of a PCB according to previous approaches.

As depicted in FIG. 1, in previous approaches a metallic or otherwise conductive tray 112 was provided with a plurality of conductive standoffs 114a,b,c extending a distance 116 from the upper surface of the tray 112. The standoffs 114a,b,c are positioned to be alignable with a plurality of screw holes 118a,b,c formed through the thickness of a printed circuit board 122. The standoffs 114a,b,c are further provided with screw threads for receiving substantially conductive screws 124a,b,c which are positioned to the screw holes 118a,b,c. In the configuration of FIG. 1, the standoffs 114a,b,c, engaged with the screws 124a,b,c provide mechanical support for holding the PCB 124 a predetermined spacing 116 above the upper surface of the tray 112. Furthermore, by providing a conductive annular region on the upper surface 126 or lower surface 128 of the PCB, in the vicinity of the one or more of the screw holes 118a, the substantially conductive screw 124a provides a conductive path from the conductive regions 126 128 to the conductive standoff 114a and thus to the tray 112 to provide, if desired, a ground path from the PCB 122 to the tray 112. Thus, in the configuration of FIG. 1, the standoff/screw mounting serves a dual purpose of mechanical support of the PCB 112 and formation of a ground path.

In a typical full sized PCB 122, it has been found that the number of screw supports for providing the desired number of ground pathways is greater than the number of screw supports needed to achieve the necessary mechanical support. For example, in a typical full sized PCB 122, there may be, e.g., around 18 to 20 standoff/screw mountings but only about 8 to 12 standoff/screw mountings are needed for mechanical support purposes (e.g., such that there is little, if any, practical benefit, in terms of mechanical support, gained from having more than about 8 to 10 well-placed screw/standoff support or mountings).

According to one embodiment of the present invention, a structure similar to that depicted in FIG. 1 is modified to replace at least some of the standoff/screw mountings with a plug structure (described more fully below) which provides an effective ground path. Preferably, sufficient screw/ standoff structures are used to provide the desired or necessary mechanical support (typically also providing at least some ground pathways) with the plug structure being used to provide at least some of the desired ground pathways.

Figure 2:
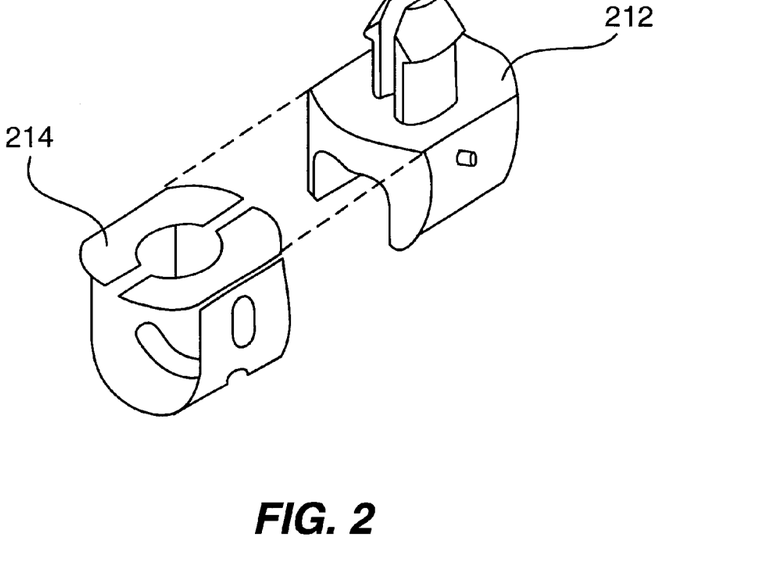
FIG. 2 is an exploded perspective view of a grounding plug according to an embodiment of the present invention.
Figure 3A:
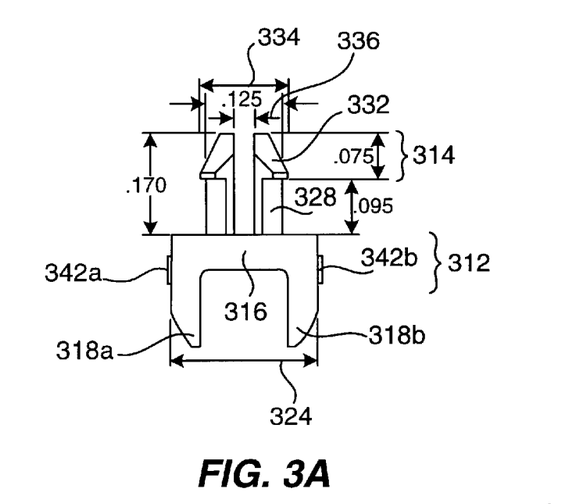
FIGS. 3A, B and C are end elevational, side elevational and top plan views of a plug body according to an embodiment of the present invention.
Figure 3B:
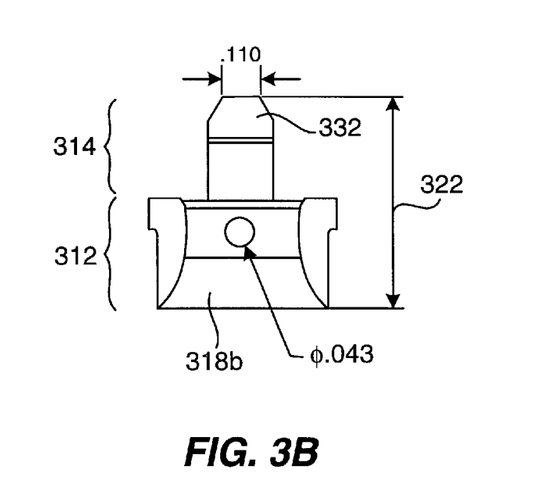
Figure 3C:
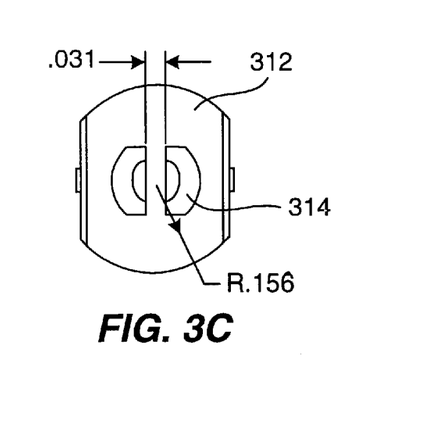
Figure 6:
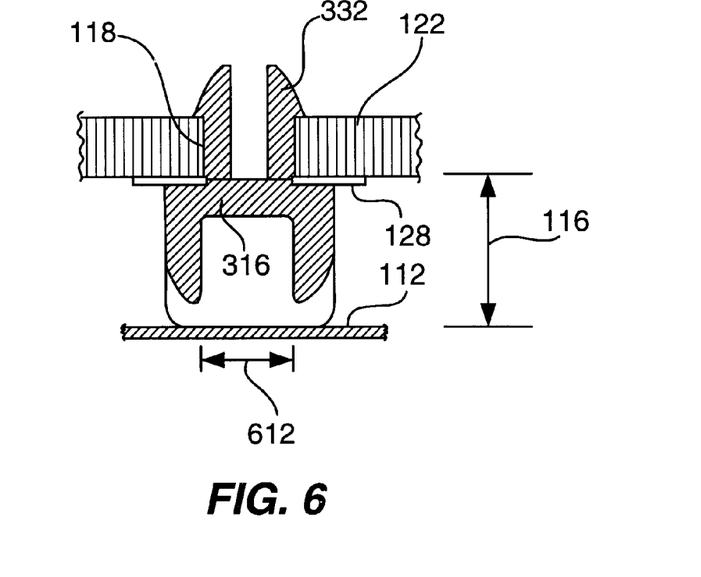
FIG. 6 is a cross-sectional view of a grounding plug mounted in a PCB, according to an embodiment of the present invention.

In the embodiment depicted in FIG. 2, a grounding plug, according to the present invention, includes a first body portion 212 and a second conductive portion 214. The body portion 212 can be formed of a number of materials. In one embodiment, the body portion is formed of acrylonitrile-butadiene-styrene (ABS) plastic. The body portion, shown in FIGS. 3A through 3C, includes a support 312 and a clip 314. In one embodiment the support 312 has a height 322 of about 0.314 inches, and a width 324 of about 0.246 inches. Other dimensions and shapes of a body portion will be understood by those of skill in the art after understanding the present disclosure. The support 312 includes an upper plate 316 and first and second opposed dependent ears 318a,b. The clip 314 includes a stem portion 328 having a size and shape which can be accommodated in the screw holes 118abc commonly provided in existing PCBs 122 (e.g. round holes with a diameter of about 0.125 inches). An upper latch portion 332, defining camming surfaces 333 has a widest dimension 334 in excess of the diameter of existing screw holes 118abc. The clip 314 is provided in first and second resilient halves which are spaced apart a distance 336 (such as about 0.031 inches) sufficient that when the resilient halves are deflected toward one another in response to pressing the camming surfaces 333 through the screw holes 118a,b,c, the latches 332 will pass through the screw holes 118a,b,c and, after clearing the PCB 112 will resiliently spring to the original relaxed configuration, capturing the PCB 122 between the latch portions 332 and the plate 316, e.g., as depicted in FIG. 6. In this way, after the conductive portion 214 has been assembled on the body 212, as described below, a grounding plug as described herein can be rapidly and readily installed on PCBs, preferably using existing screw holes, but without the need for expending the time and effort previously needed for installing a screw, and, instead, by merely pushing the plug clip 314 through existing screw holes for mounting as depicted in FIG. 6.

Figure 4A:
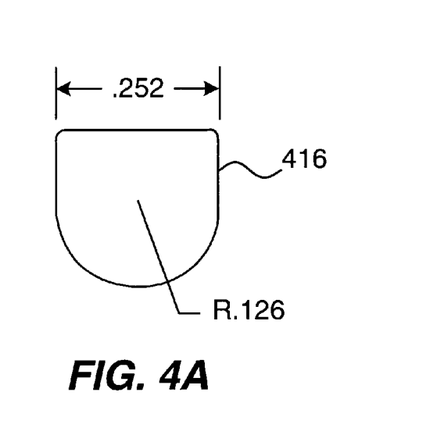
FIGS. 4A, B and C are end elevational, side elevational and top plan views of a conductive spring according to an embodiment of the present invention.
Figure 4B:
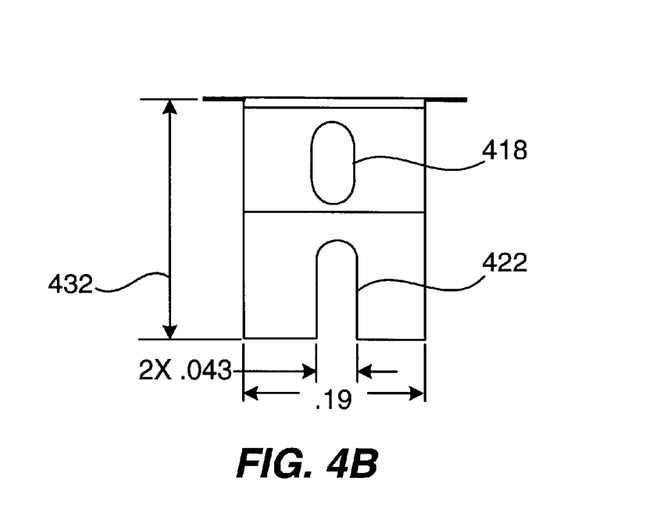
Figure 4C:
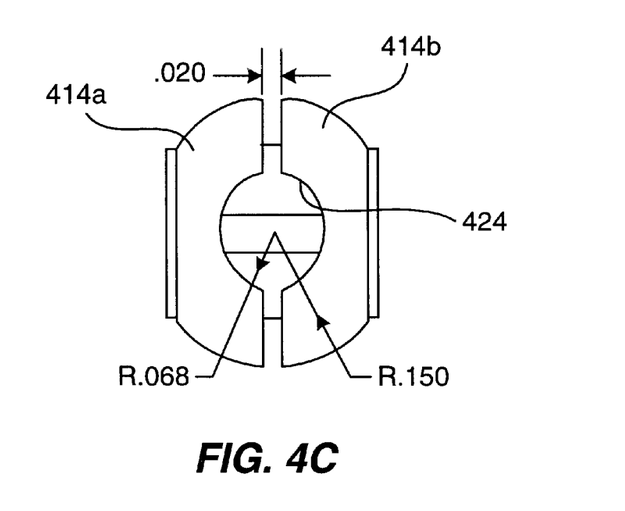
Figure 5A:
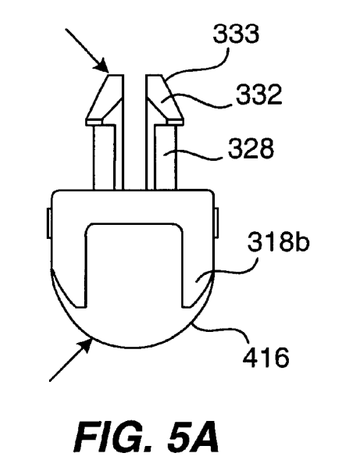
FIGS. 5A, B, and D and elevational, side elevational, top plan and perspective views of an grounding plug according to an embodiment of the present invention.
Figure 5B:
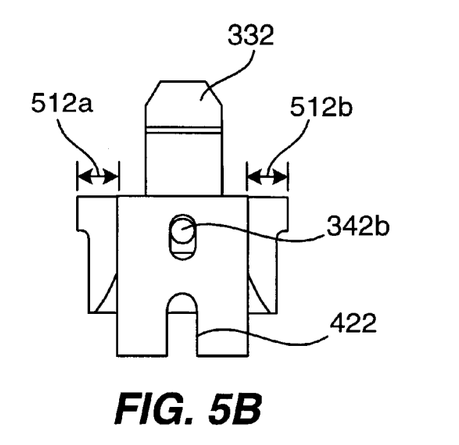
Figure 5C:
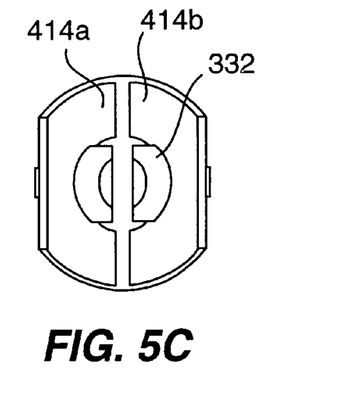
Figure 5D:
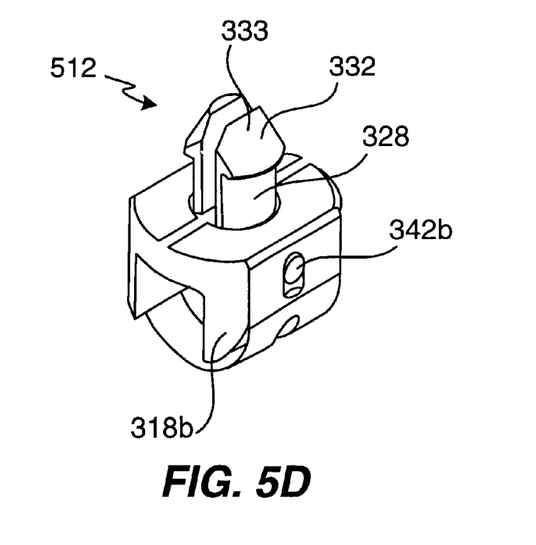

As depicted in FIGS. 4a through 4c, the conductive portion 214 includes left and right upper sheets 414a 414b continuous with a substantially U-shaped lower portion 416. In the depicted embodiment, the lower portion of 416 includes mounting holes 418 and an elongate slot 422. The upper plate or sheets 414a,b define a central opening 424 sized to accommodate the shaft 328 of the body clip 314. Preferably, at least a portion of the body of section 512a, 512b extends laterally outward beyond the lower portion 416 of the conductive portion 214, e.g., to provide a gripping region to facilitate installation of the plug onto a circuit board without unnecessarily deforming the conductive portion 214. The conductive portion 214 is formed of, or includes, a substantially conductive material. Preferably, at least the lower portion 416 is substantially deformable, preferably resiliently deformable. In one embodiment, the conductive portion 214 is formed of berrylium-copper alloy, having a thickness, e.g., of about 0.003 inches.

In one embodiment, the conductive portion 214 is initially formed as a flat sheet structure and is bent around the body portion during assembly of the plug to provide the structure as depicted in FIGS. 5a through 5d. Body portion posts 342a 342b extend through the conductive portion openings 418 and preferably are partially deformed over the edge of the openings 418, (e.g., through ultrasonic or contact heating, heat staking and the like) to fasten the conductive portion 214 to the body portion 212.

When the PCB 122 is provided with one or more grounding plugs 512 positioned in some of the PCB holes, as depicted in FIG. 6, the PCB 122 is then mounted with respect to a tray 112 using others of the PCB screw holes (i.e. holes not occupied by plugs 515) for receiving screws which engage standoffs, thus positioning the PCB 122 a distance 116 above the tray 112. Because the distance 116 is preferably somewhat less than the height 432 of the conductive portion 214, the lower section of the conductive portions 416 of installed plugs 512 are (preferably resiliently) deformed against the surface of the tray 112 as depicted in FIG. 6, thus providing a substantially planar section 612 of the (deformed) conductive portion 214 in contact with the tray 112, to achieve effective electrical contact. In this way, an effective conductive pathway is formed from a circuit board conductive region or trace 128 around a PCB hole 118, to the conductive portion upper sheets 414a 414b, to the conductive portion lower portion 416 and thus to the tray 112 (as best seen in FIG. 6), e.g. for establishing a desired grounding pathway.

As seen in FIG. 6, because the grounding plug is coupled to the PCB 112 in a snap-latch or resilient latch fashion, the grounding plug described herein does not require use of a screw, 124a,b,c, thus saving the cost of a screw, as well as the time and effort formerly needed for screw installation. Because a ground pathway is formed to the tray 112 without the need for a standoff, the number of standoffs needed for a tray 112 can be reduced, thus saving the cost of providing and installing at least some standoffs in a tray 112.

Figure 7:
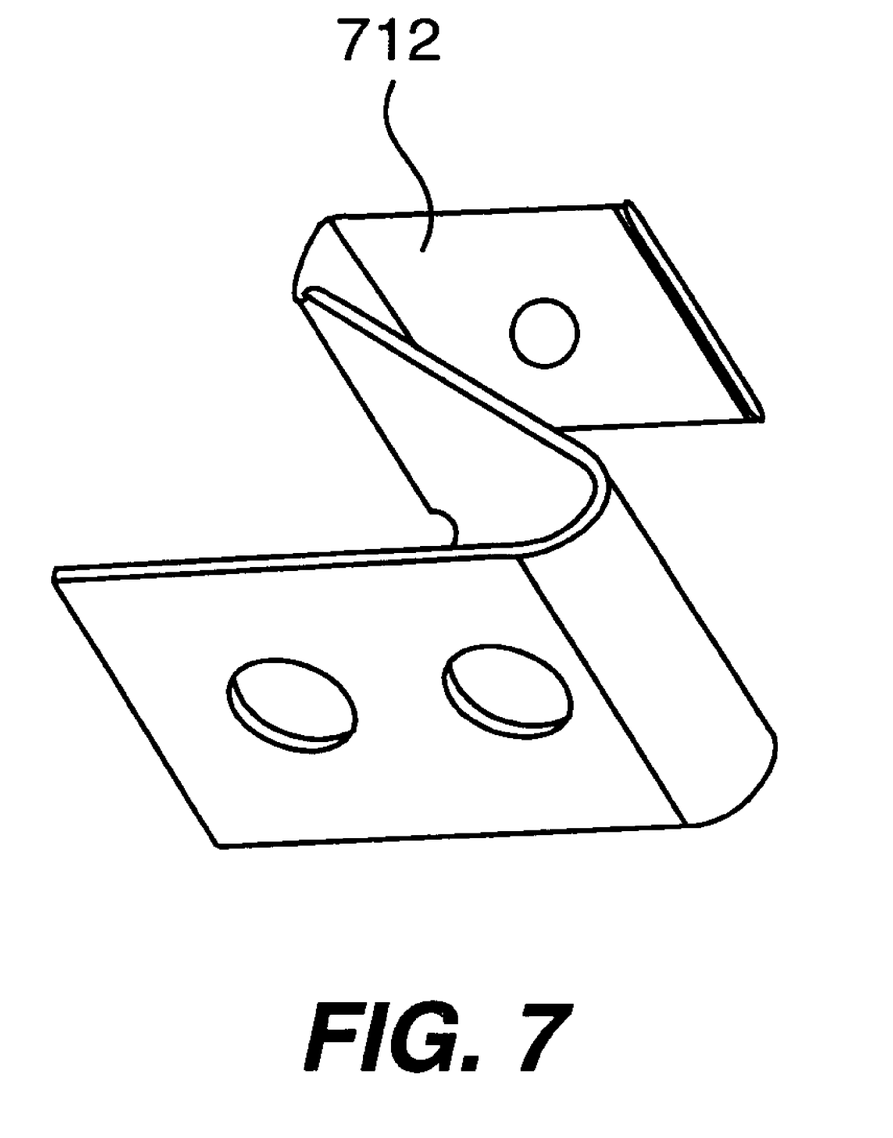
FIG. 7 is a bottom perspective view of a spring conductor according to an embodiment of the present invention.

Although the depicted generally unshaped conductive portion 214 is believed effective in achieving the desired conductive pathway, other shapes of conductive components can also be used, including, for example, a z-shaped conductive spring 712 (FIG. 7).

In light of the above description, a number of advantages of the present invention can be seen. The present invention can assist in achieving desired effective conductive pathways from a circuit board to a tray or chassis while reducing or eliminating at least some of the materials costs associated with previous approaches such as the cost of screws and standoffs. The present invention can further provide effective desired conductive pathways while reducing fabrication or assembly time such as by providing at least some structures with a rapid and simple push (snap) fastening and eliminating at least some screw operations.

A number of variations and modifications of the invention can be used. it is possible to use some aspects of the invention without using others. For example, features of the present invention can be used to reduce or eliminate the use of certain standoffs without reducing the use of screw fastenings. Although embodiments been described in terms of a structure for providing a ground path, the present invention could also be used for providing other electrically conductive paths such as signal paths, power paths and the like. Although, in one embodiment, the body portion and conductive portion were described as being separately formed and assembled, it is also possible to form to provide a grounding plug in which a body or fastening portion is formed integrally with (in a single piece with) a conductive portion or region.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus providing a conductive pathway from a circuit board to a mounting tray, said circuit board having at least a first circuit board opening therethrough and at least a first conductive region on said circuit board adjacent said first opening, the circuit board configured for mounting a first distance from said tray, the apparatus comprising:

a body member having a fastener, for coupling to the circuit board without the need for a screw coupling, said fastener configured to extend at least partially into said circuit board opening; and a substantially conductive member, coupled to said body member, having first and second portions positioned with respect to said body member, such that when said body member is coupled to the circuit board, said first portion of said conductive member contacts said conductive region of said circuit board and said second portion of said conductive member extends from said first portion of said conductive member to said tray, with at least part of said second portion being deformed, with respect to a relaxed configuration, to form at least a first substantially planar region in contact with a portion of said tray wherein the conductive member is separate from the body member.

2. Apparatus, as claimed in claim 1, wherein said fastener comprises first and second latch portions and first and second shaft portions, said first and second shaft portions resiliently deformable toward one another from a relaxed position to a deformed position wherein, in said deformed position, said latch portions define a size and shape so as to permit insertion of said latch portions through said circuit board opening and wherein, in said relaxed position, said latch portions have a size and shape exceeding the size and shape of said circuit board opening and wherein said shaft portions define a size and shape such that said shaft portions, in said relaxed configuration, can be accommodated in said circuit board opening.

3. Apparatus, as claimed in claim 1, wherein said body portion is formed of a plastic material.

4. Apparatus, as claimed in claim 1, wherein said conductive portion comprises a substantially U-shaped region wherein, when said substantially conductive member is in said relaxed configuration, said U-shaped region defines a height greater than said first distance, said conductive portion further including at least a first sheet portions, continuous with said U-shaped portion wherein at least a part of said first sheet portion includes said first portion of said conductive member.

5. Apparatus, as claimed in claim 1, wherein said body portion includes at least a first post extending through a first opening defined in said conductive portion and over at least a portion of a surface of said conductive portion for fastening said conductive portion to said body portion.

6. The apparatus of claim 1 wherein the conductive member does not correspond to a conductive coating which is formed onto an exterior surface of the body member.

7. Apparatus providing a conductive pathway from a circuit board to a mounting tray, said circuit board having at least a first circuit board opening therethrough, and at least a first conductive region on said circuit board adjacent said first opening, the circuit board configured for mounting a first distance from said tray, the apparatus comprising:

a body means;

fastener means, coupled to said body means, for coupling to the circuit board without the need for a screw coupling, said fastener means configured to extend at least partially into said circuit board opening; and conductive means, coupled to said body means, having at least first and second portions positioned with respect to said body means such that when said body means is coupled to said circuit board, said first portion of said conductive means contacts said conductive region of said circuit board and said second portion of said conductive means extends from said first portion of said conductive means to said tray, with at least part of said second portion of said conductive means being deformed, with respect to a relaxed configuration, to form at least a first substantially planar region in contact with a portion of said tray wherein the conductive means is separate from the body means.

8. Apparatus as claimed in claim 7 wherein said fastener means comprises latch means and shaft means, said fastener means being deformable from a relaxed position to a deformed position wherein, in said deformed position, said latch means defines a size and shape to permit insertion of said latch means through said circuit board opening and wherein, when said fastener is in said relaxed position, said latch means has a size and shape exceeding the size and shape of said circuit board opening and wherein, when said fastener means is in said relaxed configuration, said shaft means defines a size and shape such that said shaft means can be accommodated in said circuit board opening.

9. Apparatus as claimed in claim 7 wherein said body means is formed of a plastic material.

10. Apparatus as claimed in claim 7 wherein said conductive means comprises a substantially U-shaped means wherein, when said substantially conductive means is in said relaxed configuration, said U-shaped means defines a height greater than said first distance, said conductive means further including at least a first sheet means, continuous with said U-shaped means, wherein at least a part of said first sheet portion includes said first portion of said conductive means.

11. Apparatus as claimed in claim 7 wherein said body means includes at least a first post extending through a first opening defined in said conductive means and over at least a portion of a surface of said conductive means for coupling said conductive means to said body means.

12. The apparatus of claim 7 wherein the conductive means does not correspond to a conductive coating which is formed onto an exterior surface of the body member.

* * * * *